(12) United States Patent
Le et al.

(10) Patent No.: US 7,437,589 B2
(45) Date of Patent: Oct. 14, 2008

(54) PROVIDING PRECISE TIMING CONTROL WITHIN A STANDARDIZED TEST INSTRUMENTATION CHASSIS

(75) Inventors: Anthony Le, Santa Clara, CA (US); Glen Gomes, Santa Clara, CA (US)

(73) Assignee: Advantest Corporation, Tokyo (JP)

( * ) Notice: Subject to any disclaimer, the term of this patent is extended or adjusted under 35 U.S.C. 154(b) by 636 days.

(21) Appl. No.: 11/197,022

(22) Filed: Aug. 3, 2005

(65) Prior Publication Data

US 2007/0043990 A1    Feb. 22, 2007

(51) Int. Cl.
 *G06F 1/12* (2006.01)
(52) U.S. Cl. ..................................... 713/400
(58) Field of Classification Search .................. 713/400
See application file for complete search history.

(56) References Cited

U.S. PATENT DOCUMENTS

| 6,404,218 | B1 | 6/2002 | Le et al. | |
|---|---|---|---|---|
| 7,007,106 | B1 * | 2/2006 | Flood et al. | 709/248 |
| 7,240,231 | B2 * | 7/2007 | Conway | 713/401 |
| 7,315,791 | B2 * | 1/2008 | Ilic et al. | 702/125 |
| 7,366,939 | B2 * | 4/2008 | Le et al. | 713/400 |

OTHER PUBLICATIONS

PXI Hardware Specification, PCI eXtensions for Instrumentation, An Implementation of CompactPCI, Revision 2.2, Sep. 22, 2004, PXI Systems Alliance Copyright 1997-2004.

* cited by examiner

*Primary Examiner*—Rehana Perveen
*Assistant Examiner*—Eric Chang
(74) *Attorney, Agent, or Firm*—Morrison & Foerster LLP

(57) ABSTRACT

Precise timing control within a standardized chassis such as PXI is obtained by providing several control signals over PXI_LOCAL. A Least Common Multiple (LCM) signal enables all clocks to have coincident clock edges occurring at every LCM edge. A start sequence allows all PXI expansion cards in the test system to start at the same time. A MATCH line enables pincard modules to check for expected DUT outputs and either continue execution of their local test programs or loop back and repeat a section of the local test program in accordance with the result of the DUT output check. An End Of Test (EOT) line enables any one pincard module to abruptly end the local test programs running in all other pincard modules if an error is detected by the local test program in the pincard module.

21 Claims, 9 Drawing Sheets

US 7,437,589 B2

PROVIDING PRECISE TIMING CONTROL WITHIN A STANDARDIZED TEST INSTRUMENTATION CHASSIS

CROSS-REFERENCE TO RELATED APPLICATIONS

This invention is related to U.S. patent application Ser. No. 11/196,996 entitled "Circuit Card Synchronization Within a Standardized Test Instrumentation Chassis," filed Aug. 3, 2005, and U.S. patent application Ser. No. 11/196,873 entitled "Providing Precise Timing Control Between Multiple Standardized Test Instrumentation Chassis," filed Aug. 3, 2005.

FIELD OF THE INVENTION

This invention relates to a test system for testing semiconductor devices such as integrated circuits (ICs), and more particularly, to providing the precise timing control needed for state-of-the-art Automatic Test Equipment (ATE) systems within a standardized test instrumentation chassis such as a Peripheral Component Interconnect (PCI) eXtensions for Instrumentation (PXI) chassis.

BACKGROUND OF THE INVENTION

A major reason for the high cost of conventional state-of-the-art ATE test systems is the specialized and complex nature of the ATE tester architecture. ATE tester manufacturers typically employ a number of ATE tester platforms that are not only incompatible across companies, but also incompatible across platforms. Because of these incompatibilities, each ATE tester may require its own specialized hardware modules and software components that cannot be used on other ATE testers. This specialized hardware and software is expensive to develop and time-consuming and difficult to utilize. A steep learning curve is often required for those who assemble, program and operate such testers.

Because of the dedicated nature of conventional ATE tester architecture, all hardware and software must remain in a fixed configuration for a given ATE tester. To test an IC, a dedicated global test system program is developed that uses some or all of the ATE tester capabilities to define the test data, signals, waveforms, and current and voltage levels, as well as to collect the Device Under Test (DUT) response and determine DUT pass/fail. The specialized nature of ATE test systems lends itself to production-scale testing of large quantities of DUTs to ensure they pass all tests and are suitable for release into the stream of commerce. In such an environment, the same ATE test system and test software is used repeatedly to test each DUT.

Conversely, ATE test systems are not particularly well-suited for testing and verification of prototype devices, which may contain design or manufacturing errors or other "bugs." As mentioned above, the cost of developing specialized modules to test prototypes may be prohibitive. Moreover, the test software itself may contain errors, and the complexity of ATE test systems and the specialized nature of the ATE tester software may make it difficult to debug and modify the global test system program. ATE systems are even more ill-suited for the laboratory environment benchtop testing of "proof-of-concept" breadboards and other early-stage hardware designs, where low cost and ease of use are imperative for the test equipment.

To increase the flexibility, applicability, and to lower the cost of test systems, it would be desirable to utilize a standardized test architecture and tester software so that an ATE system could use pre-fabricated instrument cards and device driver software from third-party manufacturers, rather than design hardware modules and local test program software from scratch. The standardized architecture and tester software would also allow a test engineer to quickly make changes to the hardware and software, as needed, during pre-production testing of a device.

For example, PXI is a standardized system of electronic instruments comprised of a specified enclosure, a specified backplane and bus architecture, and plug-in cards that implement various types of instruments. PXI is a rugged Personal Computer (PC)-based platform for measurement and automation systems that combines PCI electrical-bus features with the rugged, modular, Eurocard mechanical-packaging of compactPCI (cPCI), then adds specialized synchronization buses and key software features. Further details on PXI may be found in "PXI™ Hardware Specification," Revision 2.2, Sep. 22, 2004, by PXI Systems Alliance, available online at www.pxisa.org, the contents of which are incorporated by reference herein.

FIG. 1 is an illustration of an exemplary PXI system 100 and some of the backplane bus signals provided by PXI. The PXI system 100 includes a chassis, backplane, and slots for cards or modules. Note that the PXI system 100 is controlled by a controller (not shown in FIG. 1) executing a global test system program that may be located in one of the slots in the PXI system or external to the PXI system 100 (e.g. a PC). At least one of the cards in the PXI system is a star trigger card 110, which serves as a local controller for the PXI chassis and is the central point for signals being sent to, or received from, the other cards or modules.

In the example of FIG. 1, one or more PXI cards or modules 102 and one or more star trigger cards 110 within a particular segment 104 are connected in parallel to a cPCI bus 106 and a trigger bus PXI_TRIG 108, which is shown in FIG. 1 as having eight lines PXI_TRIG[7:0] but may comprise a different number of lines. The cPCI bus 106, which is based on the cPCI specification, provides an interface between a test controller or personal computer (not shown in FIG. 1) and the star trigger card 110 and pincards or modules 102 for configuration purposes by allowing the test controller to talk to individual modules. In addition, PXI cards or modules 102 and star trigger cards 110 across all segments receive a 10 MHz reference clock PXI_CLK10 116 synchronized through the backplane to within a small delay (e.g. 1-2 ns). The cPCI bus 106 and the PXI_CLK10 116 are specified by the cPCI standard. A bridge 118 may be employed to extend signals such as the cPCI bus 106 to other segments or chassis.

To facilitate communications between modules beyond what cPCI provides, PXI provides a trigger bus PXI_TRIG 108 that is defined as a standard connection between modules. That is, any module can drive PXI_TRIG 108 and any module connected to PXI_TRIG 108 can receive signaling on PXI_TRIG 108. The PXI_TRIG 108 in FIG. 1 is illustrated as having eight lines PXI_TRIG[7:0], but in other embodiments may contain a different number of lines. Because of load limitations within PXI, which limit certain drivers to only 10 loads or modules, PXI_TRIG 108 within a PXI chassis may be segregated into different segments. PXI_TRIG 108 connects to all modules within a segment, but cannot connect to modules in other segments unless a bridge is used.

PXI also extends cPCI by daisy-chaining the star trigger card 110 and the pincards or modules 102 together using a local bus PXI_LOCAL 112 that connects to left (L) and right (R) connectors on each PXI module 102 or star trigger card 110. PXI_LOCAL 112 in FIG. 1 is illustrated as having 12 lines PXI_LOCAL[11:0], but in other embodiments may contain a different number of lines. PXI has left the specification for the local bus open and definable by the modules, so that a module or test system developer can utilize the local bus for any purpose.

In addition, the star trigger card 110 is connected to each slot in the PXI chassis across all segments through a point-to-point PXI_STAR bus 114, which is shown in FIG. 1 as having 13 lines [12:0] but may comprise a different number of lines. The PXI_STAR bus 114 allows the star trigger card 110 to start multiple modules at the same time.

The cPCI bus, PXI_CLK10, PXI_LOCAL and PXI_STAR do not have fanout limitations, and therefore can connect to all modules in all segments within a PXI chassis.

FIG. 2 shows an example of a PXI card cage or enclosure 200, and FIG. 3 shows an example of a PXI card 300. Many companies produce a large variety of PXI instruments that perform specific functions, including programmable power supplies, Arbitrary Waveform Generators (AWGs), DiGiTizers (DGTs) and Radio Frequency (RF) signal generators. PXI instruments are typically used as benchtop test equipment, or as small functional test systems. Connections from the PXI card to an external device are generally through front panel cable connections, via BNC, SMA, SMB, or other connectors determined by the PXI card designer. PXI cards usually come with software drivers for Windows®, LabView®, and the like.

Because there are many existing PXI instrument cards, use of these instrument cards as part of an ATE test system could drastically cut development time as compared to developing the same instrument from scratch. Also, when the expected production quantity of a given test system module is small, utilizing off-the-shelf instrument cards within an ATE test system can be more economical than developing a new module. Furthermore, the standardized PXI architecture and global test system software enables a test engineer to quickly make changes to the hardware and software, as needed, during pre-production testing of a device.

However, because PXI was not developed to generate the precise timing control required for state-of-the-art ATE test systems, heretofore it has been impossible to utilize PXI in sophisticated ATE test systems. Therefore, there is a need to provide precise timing control within a standardized test instrumentation chassis such as PXI so that an ATE test system with all the attendant benefits of a standardized test instrumentation system can be realized. Because the number of cards in a standardized test instrumentation chassis is fixed, there is a further need to provide precise timing control across multiple standardized test instrumentation chassis.

In particular, there is a need to have all modules in the test system start at the same time, which PXI_STAR can provide in PXI. However, PXI_STAR is limited to a fixed number of modules (e.g. 13 modules), depending on the design of the star trigger card and the backplane. If a test system with more than 13 synchronous modules is desired, then something besides PXI_STAR must be used. A second need stems from the fact that although PXI provides PXI_CLK10, test system modules may operate at faster clock frequencies generated within the modules such as 20.833 MHz, 125 MHz, and the like. The modules cannot be started at the same time if these clocks are not in synchronization with each other. Thus, there is a need to synchronize clocks generated within the modules.

A third need is driven by that fact that a PXI chassis can only hold a certain number of modules, yet some test systems will require a greater number of modules than one chassis can hold. Multiple PXI chassis may therefore be needed to hold all of the modules in a test system. PXI is capable of addressing modules across chassis. In addition, a limited multi-chassis synchronization capability exists within PXI, through a bridge constrained to the cPCI protocol. This cPCI bridge allows PCI communications between modules in different chassis. However, PXI has no provision for connecting the other signals (PXI_CLK10, PXI_TRIG, PXI_LOCAL and PXI_STAR) to multiple chassis. Therefore, there is no mechanism in PXI to allow modules to start at the same time or generate fast clocks in synchronization across chassis. This creates a need to synchronize clocks and modules across multiple PXI chassis.

In ATE test systems, each pin on each module or pincard may contain an Application Specific Integrated Circuit (ASIC), memory such as Random Access Memory (RAM), and other pin electronics, and may execute a local test program to generate vectors for a DUT input pin. The basic configuration, synchronization and starting of pins and modules within a chassis is controlled by global test system software being executed in a controller, but in per-pin testers, each pincard or module executes its own local test program.

The local test program for each pin must be precisely started or stopped in order for the overall test system to operate properly. In addition to start and stop operations, there are operations to loop around within the local test program. For example, when executing a local test program, at a certain vector the local test program may need to check for certain conditions (i.e. look for a certain output on a DUT output pin) and, based on this check, decide whether to continue (if the expected conditions are observed) or loop back and repeat a portion of the local test program (if the expected conditions are not observed). This loop-back capability is frequently needed for Phase-Locked Loops (PLLs), where the PLL must have stabilized before further testing can begin. For example, other modules may have to loop-back and repeat sections of their local test program while waiting for the PLL to stabilize. In other test systems, a proprietary connection is used for this purpose. However, PXI does not provide for a loop-back capability in which modules in the test system can simultaneously determine that loop-back is required. Therefore, a mechanism is needed within the confines of PXI to indicate to the modules to either loop-back and repeat sections of their local test programs, or continue with their local test program.

SUMMARY OF THE INVENTION

Embodiments of the present invention are directed to providing precise timing control within a standardized test instrumentation chassis such as PXI so that a test system with all the attendant benefits of a standardized test instrumentation system can be realized. Precise timing control is obtained by providing reference clock such as PXI_CLK10 over specification-compliant matched length reference clock traces and several non-specification control signals over a bus such as PXI_LOCAL. In particular, a Least Common Multiple (LCM) signal is generated, distributed over PXI_LOCAL and utilized such that all of the clocks generated in the test system can be synchronized to have coincident clock edges occurring at every LCM edge. A start sequence is also generated, distributed over PXI_LOCAL such that all PXI expansion cards and modules in the test system can start at the same time. In addition, a MATCH line may be provided over PXI_LOCAL to enable pincard modules to check for expected DUT outputs and either continue execution of their local test programs or loop back and repeat a section of the local test program in accordance with the result of the DUT output check. An End Of Test (EOT) line is similarly provided over PXI_LOCAL to enable any one pincard module to abruptly end the local test programs running in all other pincard modules if an error is detected by the local test program in the pincard module.

A PXI chassis that has been adapted for precise timing may include modules or pincards that need to receive a 10 MHz clock PXI_CLK10 and generate high frequency clocks. Such modules or pincards may contains a clock generation circuit that generates signals such as a 125 MHz Master CLocK (MCLK) and a 20.833 MHz Bus CLocK (BCLK). MCLK and BCLK may need to be synchronized because there are times when a control signal or data must be passed from a slower frequency domain (e.g. BCLK) to a faster frequency domain (e.g. MCLK). The clock generation circuit includes a PLL, a synchronizer pulse circuit and a divider circuit. PXI_CLK10 from a PXI compliant star trigger card is received by the PLL, which then generates a 250 MHz clock. The 250 MHz clock is sent to the divider circuit that generates the 125 MHz MCLK (which is a divide-by-two of the 250 MHz clock) and the 20.833 MHz BCLK (which is a divide-by-12 of the 250 MHz clock). The 250 MHz clock is also sent to the synchronizer pulse circuit, which also receives an LCM signal and generates a synchronization pulse. The synchronization pulse is received by the divider circuit and helps the divider circuit to generate MCLK and BCLK in synchronization.

The LCM signal is selected as having a period equivalent to the least common multiple of the clock periods of all clocks in the test system that need to be precisely synchronized, such as PXI_CLK10, BCLK and MCLK. The least common multiple of the periods of these signals is 1200 ns, and thus LCM signal has a 1200 ns period and is generated within the star trigger card as a divide-by-12 of PXI_CLK10. By choosing the LCM signal as described above, all of the clock signals generated on any module will have an integer number of clock cycles within the LCM period. The divider circuit utilizes the synchronization pulse to generate MCLK and BCLK so that each of them has a rising edge coincident with the rising edge of the LCM. The LCM signal is transmitted on one of the local bus lines (e.g. PXI_LOCAL0) to all modules that need to be synchronized.

A known sequence representing a start condition may be placed on PXI_LOCAL that can be detected by all modules. When a DUT is to be tested, each module is first configured and armed by the global test system software in the controller, and once armed, each module looks at a particular time on PXI_LOCAL for the known sequence that represents the starting condition. When the known start sequence is detected at the expected time, the local test program in the module starts. Two PXI_LOCAL signals may be utilized for this start sequence, identified herein as START[1,2], and the particular time may be defined as the rising edge of the LCM signal. The star trigger card may place a start sequence on START[1,2], which are daisy-chained to all other modules in the chassis. The start sequence is applied to PXI_LOCAL during the first PXI_CLK10 period after the LCM signal goes high. By doing so, all modules are guaranteed to see this start sequence when PXI_CLK10 goes low.

A MATCH line may be provided over PXI_LOCAL to enable pincard modules to check for expected DUT outputs and either continue execution of their local test programs or loop back and repeat a section of the local test program in accordance with the result of the DUT output checks. The MATCH line may be provided over one of the same PXI_LOCAL bus lines used to carry known sequences for starting modules. This dual use is possible because once the known sequence is present at the particular time (LCM rising edge), that PXI_LOCAL bus line is no longer needed for starting modules until the next LCM rising edge. In any case, each of the modules can drive the PXI_LOCAL bus line used for the MATCH line, and each of the modules can read the MATCH line from PXI_LOCAL.

When one module detects a mismatched condition (an unexpected DUT output), it may drive the PXI_LOCAL bus line that is being used as a MATCH line low as an indication of mismatched conditions. This mismatched condition will be detected by the other modules, which will either continue or repeat a portion of their local test programs, as appropriate.

An EOT line is similarly provided over PXI_LOCAL to enable any one pincard module to abruptly end the local test programs running in all other pincard modules if an error is detected by the local test program in the pincard module. By enabling modules to drive an EOT line that can be read by all other modules, the local test programs in all modules can be stopped without intervention by the global test system program in the controller. The EOT line may be provided over one of the same PXI_LOCAL bus lines used to carry known sequences for starting modules. Any module that experiences an error condition may drive the EOT line low, and all modules may subsequently read the EOT line to determine if any module has experienced an error condition. If any module experienced an error condition and drove the EOT line low, then all modules will immediately end their local test programs.

The precise timing and synchronization described above may be expanded to multi-chassis test systems. In multi-chassis embodiments, PXI_CLK10, LCM, START, MATCH and EOT from a PXI-compliant master star trigger card in chassis may be sent to a PXI-compliant slave star trigger card in one or more other PXI-compliant chassis via matched length differential cables and separate connectors on the master star trigger card. A dedicated connector may be employed for each chassis to ensure that the delay to each chassis is the same.

DETAILED DESCRIPTION OF THE PREFERRED EMBODIMENT

In the following description of preferred embodiments, reference is made to the accompanying drawings which form a part hereof, and in which it is shown by way of illustration specific embodiments in which the invention may be practiced. It is to be understood that other embodiments may be utilized and structural changes may be made without departing from the scope of the preferred embodiments of the present invention.

In particular, it should be noted that although embodiments of the present invention are described herein for use with a PXI chassis for purposes of illustration and explanation, other standardized test instrumentation chassis having standardized specifications and specification-compliant ports and backplanes fall within the scope of the present invention. For example, cPCI is similar to PXI, but with a slightly different form factor and bus structure.

Embodiments of the present invention are directed to providing precise timing control within a test instrumentation chassis having a standardized specification such as PXI so that a test system with all the attendant benefits of a standardized test instrumentation system can be realized. Precise timing control is obtained by providing a reference clock such as PXI_CLK10 to all specification-compliant circuit cards over pre-existing specification-compliant matched-length reference clock traces, and by providing several non-specification control signals over a pre-existing bus with an open, user-configurable specification such as PXI_LOCAL that is connectable in parallel to all circuit cards across all segments in the chassis via specification-compliant traces on the chassis backplane. Non-specification control signals, and defined herein, are control signals that are not defined in the standardized specification.

In particular, a Least Common Multiple (LCM) signal is generated, distributed over a bus such as PXI_LOCAL and utilized such that all of the clocks generated in the test system can be synchronized to have coincident clock edges (e.g. rising edges) occurring at every LCM edge. A start sequence is also generated, distributed over a bus such as PXI_LOCAL and utilized such that all specification-compliant circuit cards such as PXI expansion cards and modules in the test system can start at the same time. In addition, a MATCH line may be provided over a bus such as PXI_LOCAL to enable pincard modules to check for expected DUT outputs and either continue execution of their local test programs or loop back and repeat a section of the local test program in accordance with the result of the DUT output check. An End Of Test (EOT) line is similarly provided over a bus such as PXI_LOCAL to enable any one pincard module to abruptly end the local test programs running in all other pincard modules if an error is detected by the local test program in the pincard module.

Figure 1:
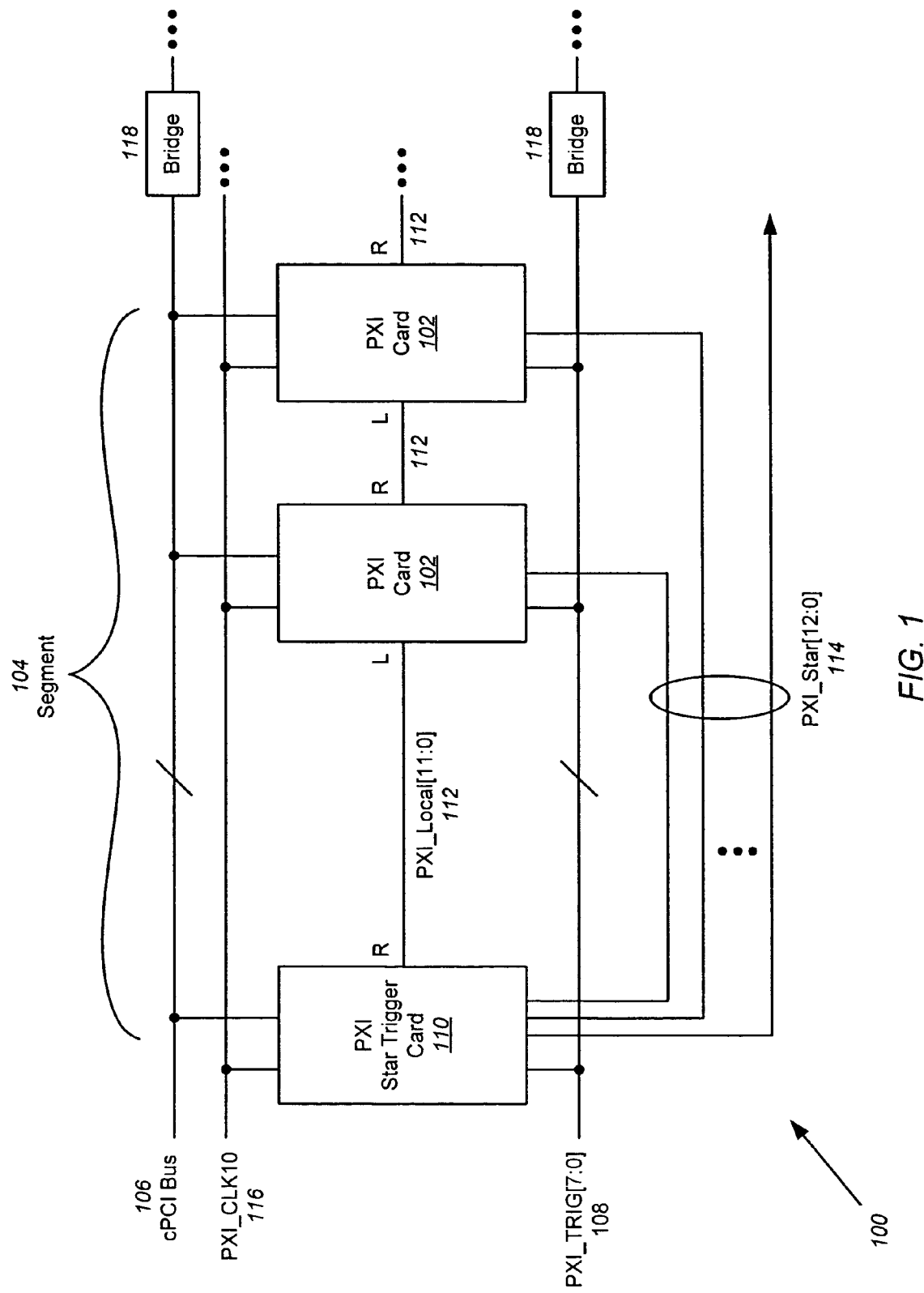
FIG. 1 illustrates an exemplary PXI system and some of the backplane bus signals provided by PXI.
Figure 2:
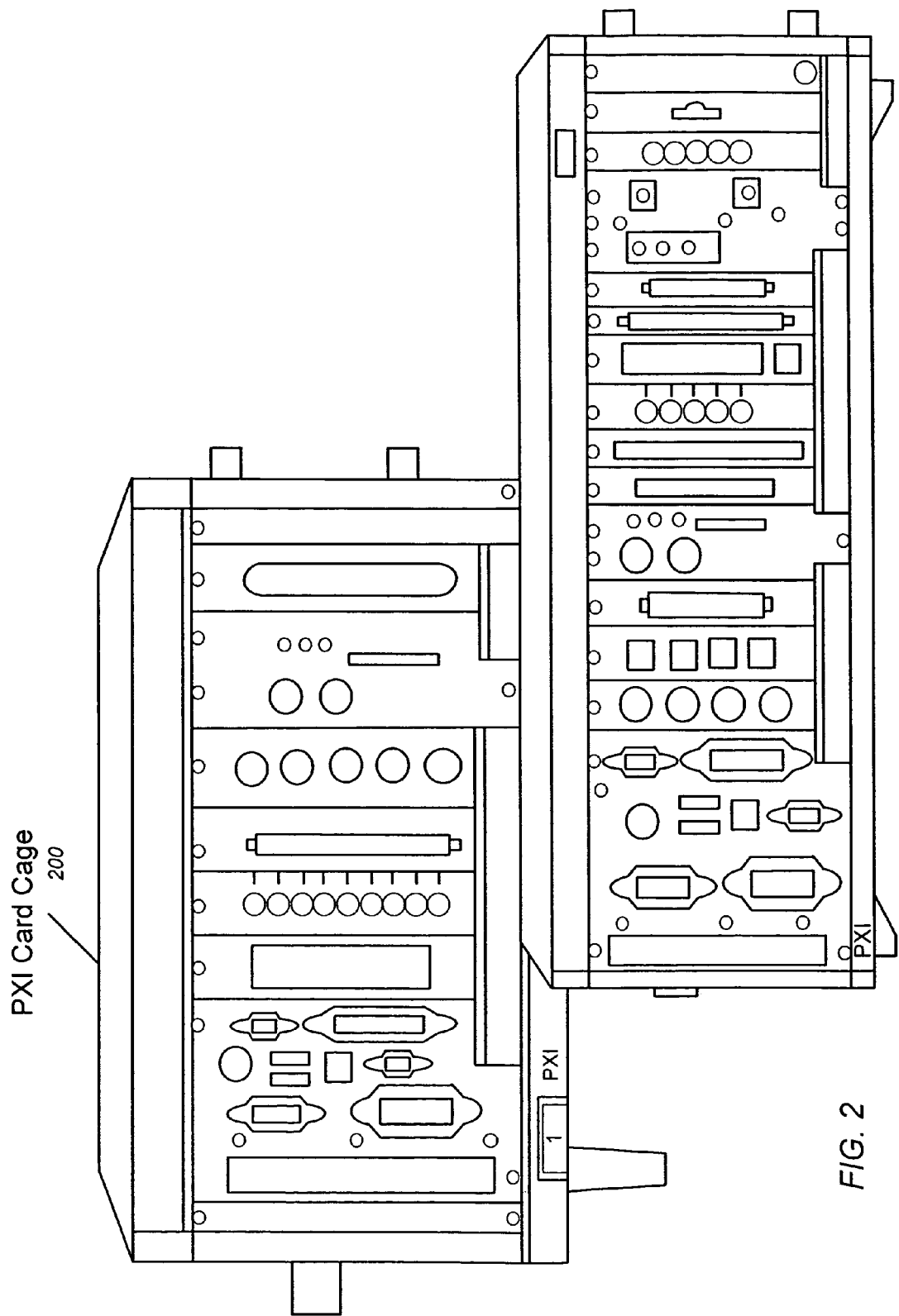
FIG. 2 illustrates an exemplary PXI card cage or enclosure.
Figure 3:
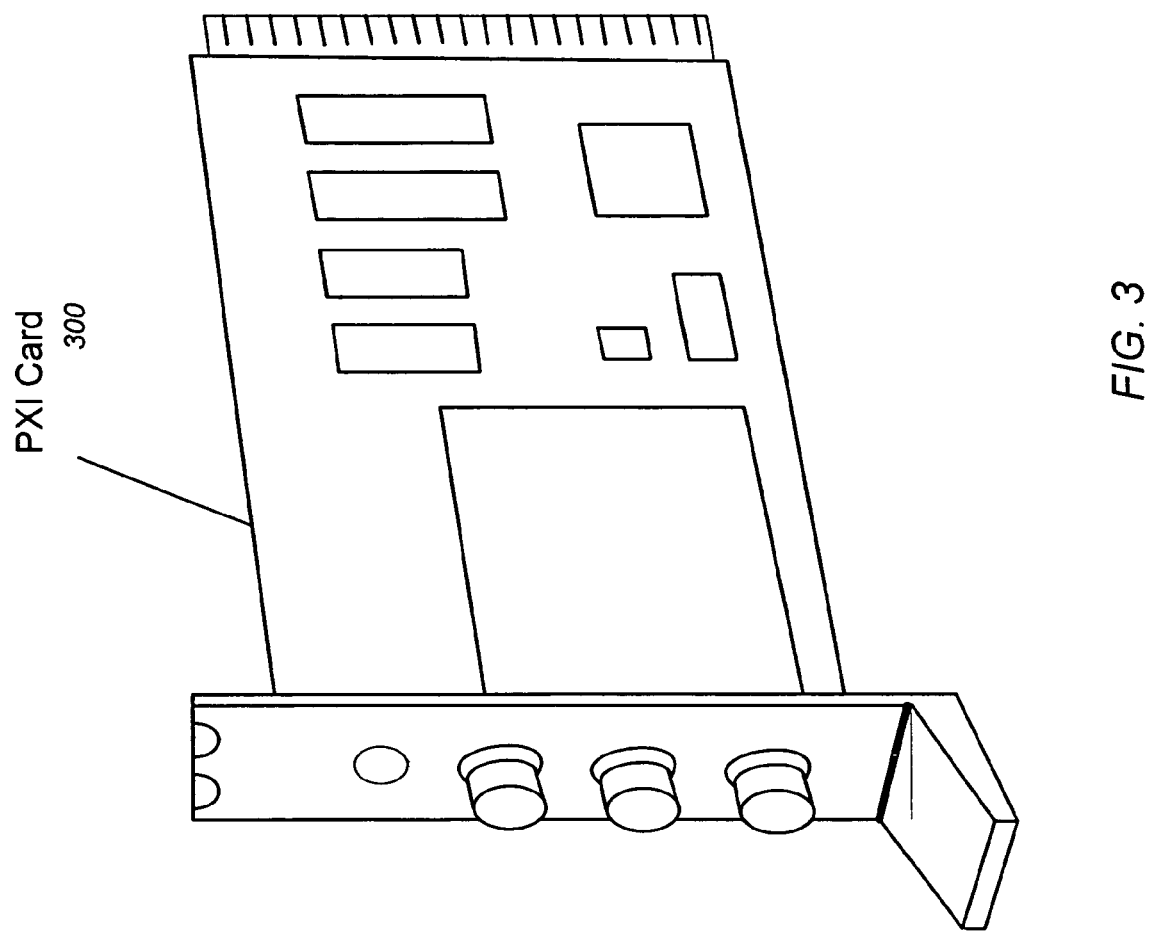
FIG. 3 illustrates an exemplary PXI card.
Figure 4:
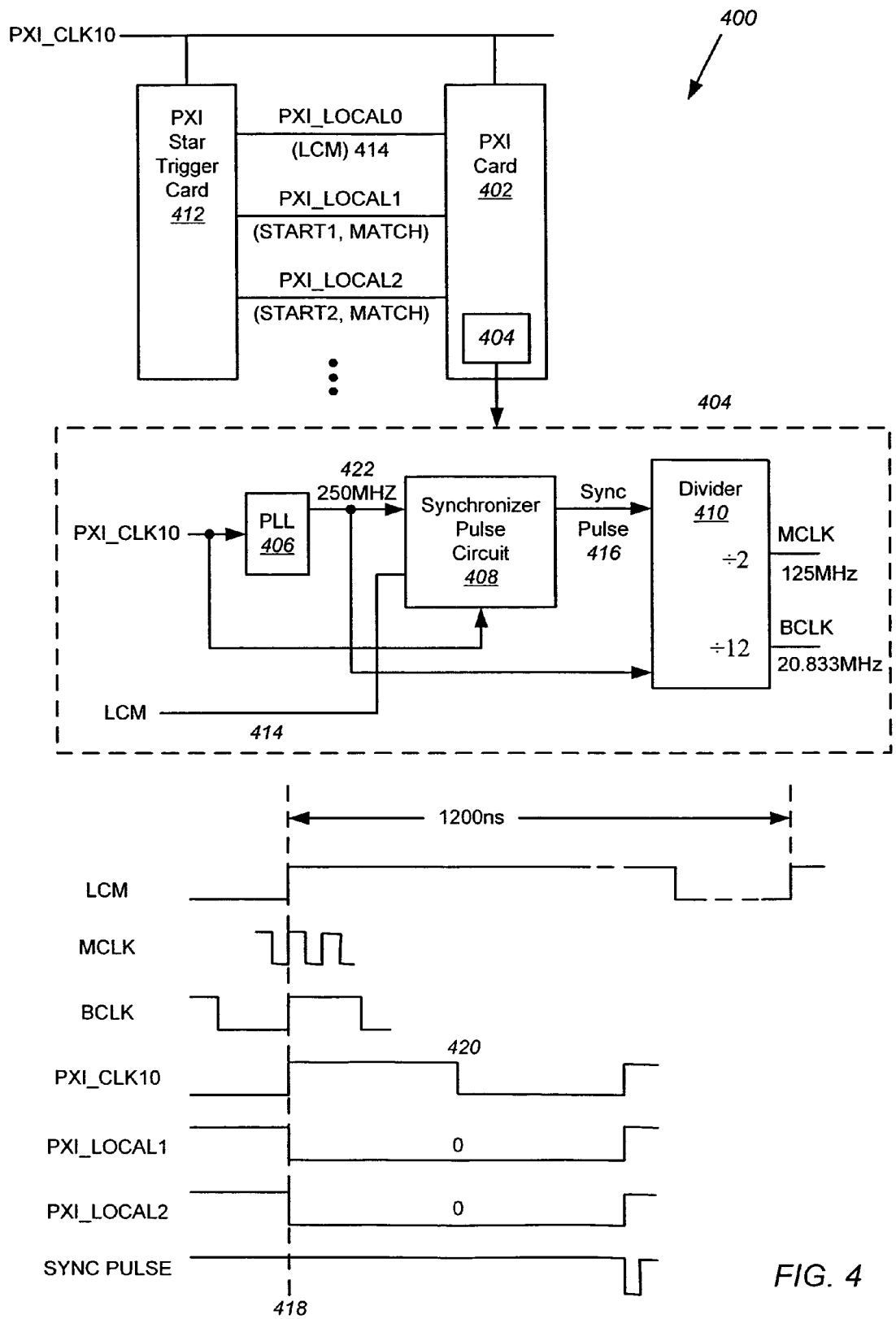
FIG. 4 illustrates an exemplary PXI chassis that has been adapted for precise timing according to embodiments of the present invention.

Generating fast clocks in sync. FIG. 4 illustrates a block diagram of an exemplary PXI chassis 400 that has been adapted for precise timing according to embodiments of the present invention. As noted above, in an ATE test system, circuit cards, modules or pincards may need to receive a reference clock such as PXI_CLK10 and generate high frequency clocks. In the example of FIG. 4, a circuit card, module or pincard 402 contains a clock generation circuit 404 that generates a 125 MHz Master CLocK (MCLK) and a 20.833 MHz Bus CLocK (BCLK). BCLK is a control frequency that is utilized by the backplane bus for communicating with all of the cards in the PXI chassis. The control frequency is utilized for bus protocols, register programming, and any other facility that needs to be controlled at a lower speed. MCLK is an event frequency, which is the frequency that drives the tester pin circuitry. The event frequency is the rate at which events are generated in an event-based system. In embodiments of the present invention, the event and control frequencies need to be synchronized because there are times when a control signal or data must be passed from a slower frequency domain (e.g. BCLK) to a faster frequency domain (e.g. MCLK). Note that although 125 MHz and 20.833 MHz are used herein for purposes of illustration, it should be understood that other clock frequencies fall within the scope of the present invention.

The clock generation circuit 404 includes a PLL 406, a synchronizer pulse circuit 408 and a divider circuit 410. The reference clock such as PXI_CLK10 from a PXI compliant star trigger card 412 is received by the PLL 406, which then generates a PLL clock 422 such as a 250 MHz clock using a standard off-the-shelf clock synthesizer part such as an Integrated Circuit Systems (ICS) 8432 Frequency Synthesizer. The 250 MHz PLL clock is sent to the divider circuit 410 that generates the 125 MHz MCLK (which is a divide-by-two of the 250 MHz clock) and the 20.833 MHz BCLK (which is a divide-by-12 of the 250 MHz clock) using a parts such as an ON Semiconductor® MC100EP016 counter, an MC100EP05 AND/NAND gate, and an MC100EP29 D flip-flop. The 250 MHz clock is also sent to the synchronizer pulse circuit 408, which also receives an LCM signal 414 and generates a synchronization pulse 416. The synchronization pulse 416 is received by the divider circuit 410 and helps the divider circuit 410 to generate MCLK and BCLK in synchronization.

In embodiments of the present invention the LCM signal 414 is selected as having a period equivalent to the least common multiple of the clock periods of all clocks in the test system that need to be precisely synchronized. In the present example, PXI_CLK10 has a clock period of 100 ns, MCLK has a clock period of 8 ns and BCLK has a clock period of 48 ns. The least common multiple of 100 ns, 8 ns and 48 ns is 1200 ns, and thus LCM signal 414 has a 1200 ns period and is generated within the star trigger card 412 as a divide-by-12 of PXI_CLK10. By choosing the LCM signal 414 as described above, all of the clock signals generated on any module will have an integer number of clock cycles within the LCM period. In the present example, PXI_CLK10 has 12 clock periods with a 1200 ns LCM period, BCLK has 25 clock periods within the 1200 ns LCM period, while MCLK has 150 clock periods within the 1200 ns LCM period. By using clocks with integer number of clock periods within the LCM period, there are no truncated clock periods involved, which results in less jitter on the clock signals.

Figure 10:
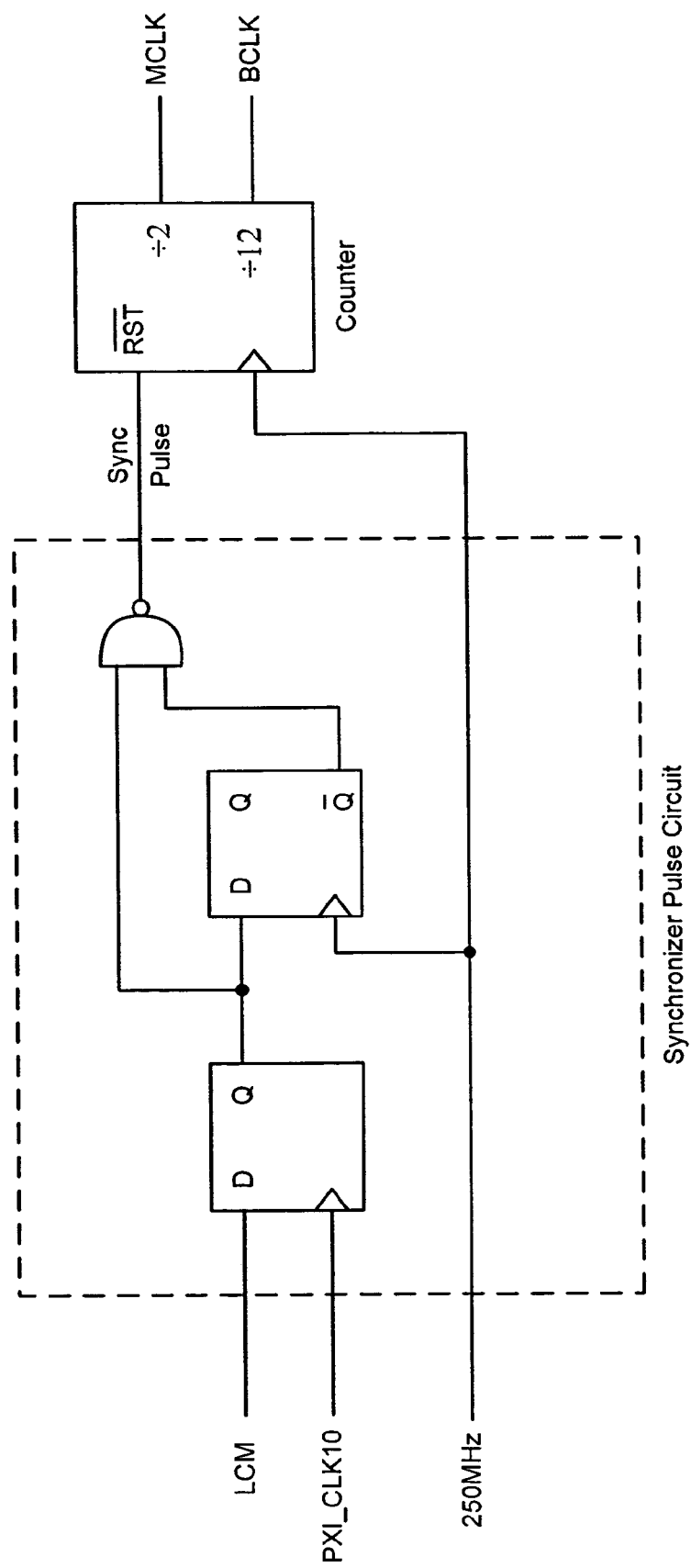
FIG. 10 illustrates an exemplary logic circuit for generating MCLK and BCLK according to embodiments of the present invention.

The divider circuit 410 utilizes the synchronization pulse 416 to generate MCLK and BCLK so that each of them has like edges (e.g. rising edges) coincident with like edges of PXI_CLK10 and the LCM, as shown at 418. FIG. 10 illustrates an exemplary logic circuit for generating MCLK and BCLK according to embodiments of the present invention.

The result of utilizing the LCM signal 414 to synchronize the clocks generated within the test system is that modules can be created having clocks that are not normally synchronous with PXI_CLK10, yet are guaranteed to be synchronous at one time in particular, the rising edge of the LCM signal 414. For any of these modules, when the rising edges of their clocks are aligned with the rising edge of the LCM signal 414, it is possible to pass control signals and data from one module to another and from one frequency domain to another.

In embodiments of the present invention, the LCM signal 414 is transmitted on one of the local bus lines (e.g. PXI_LOCAL0) to all modules that need to be synchronized. After the LCM signal 414 is received onto a module, it is re-synchronized with PXI_CLK10 so that each circuit in each module sees the LCM signal 414 at about the same time, and each module can start, stop, and transfer data or control signals at the same time. Every module that needs high timing precision, whether it generates clocks or not, may benefit from receiving the LCM signal 414.

Starting modules. As described above, PXI provides a fixed number (e.g. 13) of point-to-point PXI_STAR lines between the star trigger card and other modules for starting the local test programs in the other modules. However, some test systems may require more modules than the fixed number of point-to-point PXI_STAR lines provided by the PXI chassis and backplane. Embodiments of the present invention overcome this limitation by placing a known sequence representing a start condition on PXI_LOCAL that can be detected by all modules. When a DUT is to be tested, each module is first configured and armed by the global test system software in the controller, and once armed, each module looks at a predetermined time on PXI_LOCAL for the known sequence that represents the starting condition. When the known start sequence is detected at the expected time, the local test program in the module starts.

In one embodiment of the present invention illustrated in FIG. 4, two local bus signals (e.g. PXI_LOCAL[1,2]) may be utilized for this start sequence, identified herein as START[1, 2], and the predetermined time may be defined as the first PXI_CLK period after the like edge (e.g. rising edge) of the LCM signal 414. The star trigger card 412 may place a start sequence (e.g. [0,0]) on START[1,2], which are daisy-chained to all other modules in the chassis. The start sequence is applied to PXI_LOCAL[1,2] during the first PXI_CLK10 period after the LCM signal 414 goes high. By doing so, all modules are guaranteed to see this start sequence when PXI_CLK10 goes low at 420.

Matching conditions. As described above, in embodiments of the present invention a MATCH line may be provided over PXI_LOCAL to enable pincard modules to check for expected DUT outputs and either continue execution of their local test programs or loop back and repeat a section of the local test program in accordance with the result of the DUT output checks. In one embodiment illustrated in FIG. 4, the MATCH line may be provided over one of the same PXI_LOCAL bus lines used to carry known sequences for starting modules (e.g. PXI_LOCAL1 in the example of FIG. 4). This dual use is possible because once the known start sequence is present at the predetermined time (e.g. first PXI_CLK10 period following the LCM rising edge), PXI_LOCAL1 is no longer needed for starting modules until the next LCM rising edge. In any case, each of the modules can drive the PXI_LOCAL1 bus line used for the MATCH line, and each of the modules can read the MATCH line from PXI_LOCAL1.

The function of the MATCH line is illustrated in the following example. After PXI_LOCAL[1,2] are driven low [0,0] at the LCM signal rising edge to indicate a module start sequence, PXI_LOCAL[1,2] may be driven or float to a high state [1,1], indicating no activity. However, when one module detects a mismatched condition (an unexpected DUT output), it may de-assert the PXI_LOCAL1 bus line that is being used as a MATCH line (e.g. drive the line low), so for example a [0,1] may appear on PXI_LOCAL[1,2] as an indication of mismatched conditions. This mismatched condition will be detected by the other modules, which will either continue or repeat a portion of their local test programs, as appropriate.

Figure 5:
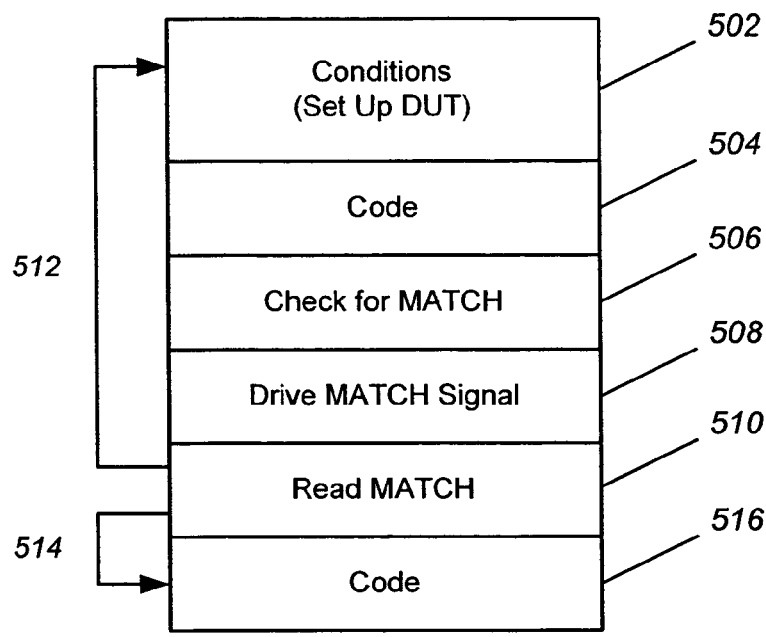
FIG. 5 illustrates an exemplary local test program executable by modules that utilize a MATCH line according to embodiments of the present invention.

Modules that utilize the MATCH line execute a local test program, an example of which is illustrated in FIG. 5. In the local test program 500 of FIG. 5, a first section of code 502 establishes conditions and initializes the DUT. After a second section of code 504 is executed, the local test program checks the DUT output for an expected condition at 506. Depending on the outcome of the check, the local test program will either drive the MATCH line high or low at 508. The MATCH line may then be read at 510, and if a zero appears on the MATCH line, this indicates that a mismatched condition exists in one or more of the modules, and the local test program loops back to repeat the first and second sections of code at 512. However, if a high appears on the MATCH line, this indicates that matching conditions exist in all modules, and the local test program continues on at 514 to execute a third section of code 516. Note that any module that experiences a mismatched condition may drive the MATCH line low, and that all modules subsequently read the MATCH line to determine if any module has experienced a mismatched condition. If any module experienced a mismatched condition and drove the MATCH line low, then all modules will loop back in their local test programs and repeat the first and second sections of code.

End of Test. As mentioned above, an EOT line is similarly provided over PXI_LOCAL to enable any one pincard module to abruptly end the local test programs running in all other pincard modules if an error is detected by the local test program in the pincard module. The purpose of the EOT line is not for synchronization, but rather for local test program efficiency by being able to stop every module and pin within a reasonable amount of time. As noted above, a local test program is executed for each pin on each module. Some local test programs are long, and some are short. If a short local test program checks the DUT and finds an error, it would be preferable to stop all local test programs in other modules immediately rather than wait for all local test programs to finish. By enabling modules to drive an EOT line that can be read by all other modules, the local test programs in all modules can be stopped without intervention by the global test system program in the controller. In one embodiment illustrated in FIG. 4, the EOT line may be provided over one of the same PXI_LOCAL bus lines used to carry known sequences for starting modules (e.g. PXI_LOCAL2 in the example of FIG. 4). Each of the modules can drive the PXI_LOCAL2 bus line used for the EOT line, and each of the modules can read the EOT line from PXI_LOCAL2.

The function of the EOT line is illustrated in the following example. After PXI_LOCAL[1,2] are driven low [0,0] at the LCM signal rising edge for to indicate a module start sequence, PXI_LOCAL[1,2] may be driven or float to a high state [1,1], indicating no activity. However, when one module detects a DUT error, it may drive the PXI_LOCAL2 bus line that is being used as a EOT line low, so for example a [1,0] may appear on PXI_LOCAL[1,2] as an indication of an error condition. This error condition will be detected by the other modules, which will then immediately stop their local test programs and end the test. Note that any module that experiences an error condition may drive the EOT line low, and that all modules subsequently read the EOT line to determine if any module has experienced an error condition. If any module experienced an error condition and drove the EOT line low, then all modules will immediately end their local test programs.

Figure 6:
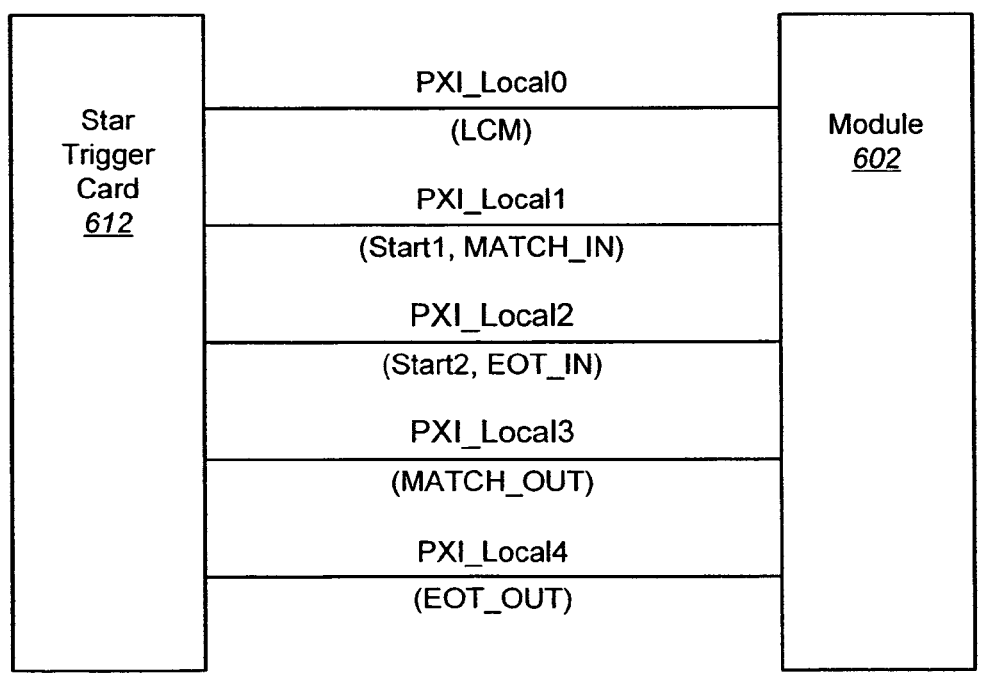
FIG. 6 illustrates an exemplary PXI_LOCAL bus in which two PXI_LOCAL bus lines have been utilized for the MATCH line and two PXI_LOCAL bus lines have been utilized for the EOT line according to embodiments of the present invention.

Use of PXI_LOCAL. The MATCH and EOT lines were described above and illustrated in FIG. 4 as consuming one PXI_LOCAL bus line each. However, in alternative embodiments of the present invention, two PXI_LOCAL bus lines may be utilized for the MATCH line, and two PXI_LOCAL bus lines may be utilized for the EOT line. In this embodiment, which is illustrated in FIG. 6, each of the modules 602 in the test system 600 is capable of driving a MATCH_OUT line to a low state if a mismatched condition is detected. The MATCH_OUT line is received by the star trigger card 612 and sent back out over another PXI_LOCAL bus line as MATCH_IN. Each of the modules 602 is capable of reading MATCH_IN to determine whether their test programs should continue or loop back. Similarly, each of the modules 602 is capable of driving an EOT_OUT line to a low state if an error condition is detected. The EOT_OUT line is received by the star trigger card 612 and sent back out over another PXI_LOCAL bus line as EOT_IN. Each of the modules 602 is capable of reading EOT_IN to determine whether their test programs should terminate. Note that in the embodiment of FIG. 6, only five PXI_LOCAL bus lines are consumed, because two of PXI_LOCAL bus lines (specifically, PXI_LOCAL[1,2]) have a dual use, first as START lines and then as MATCH_IN and EOT_IN lines.

Figure 7:
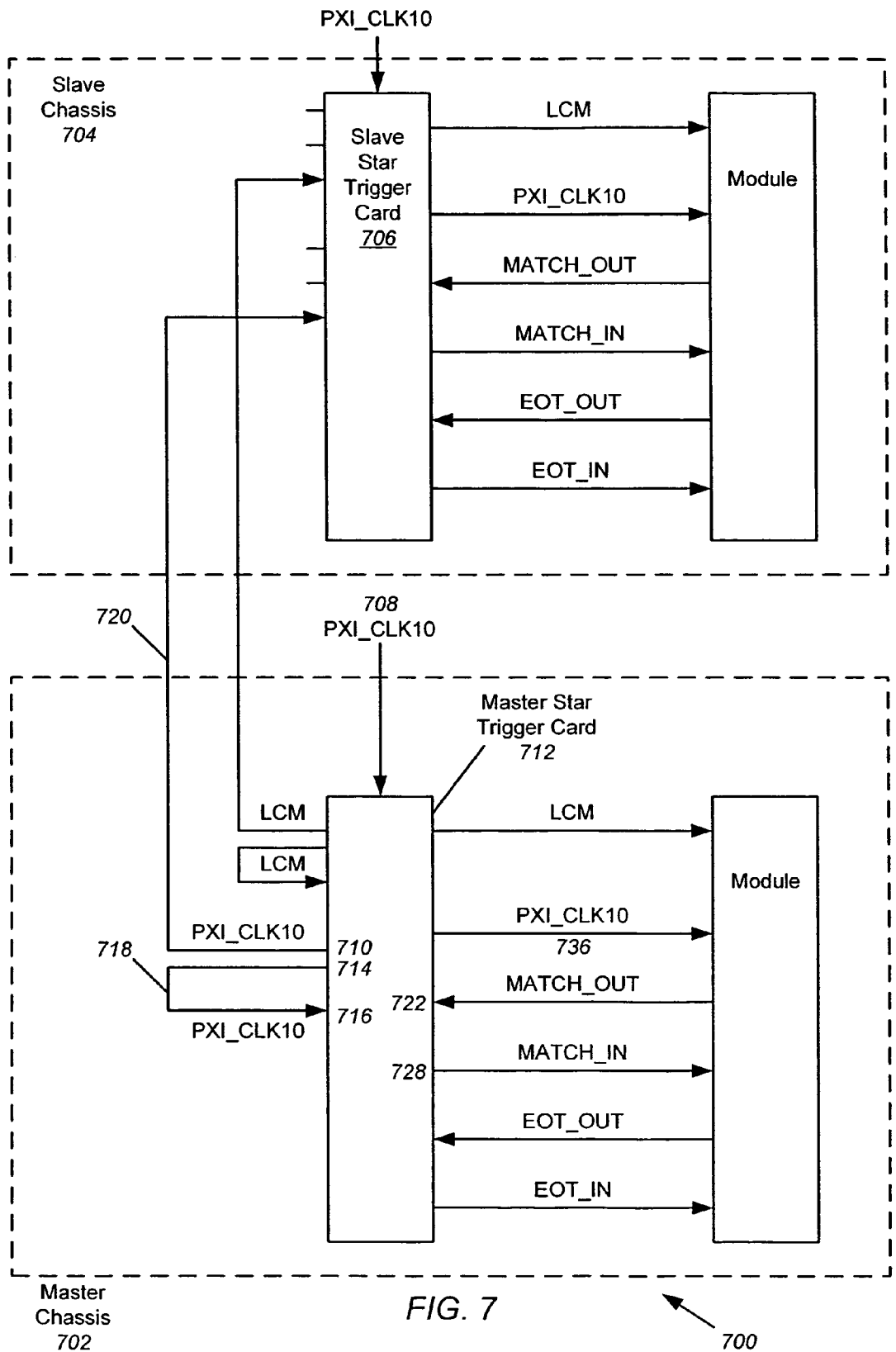
FIG. 7 illustrates an exemplary test system comprising multiple PXI chassis with precise timing and synchronization control according to embodiments of the present invention.

Multiple chassis. As illustrated in FIG. 7, the precise timing and synchronization described above may be expanded to multi-chassis test systems 700 according to embodiments of the present invention. In multi-chassis embodiments, PXI_CLK10, LCM, and START from a PXI-compliant master star trigger card 712 in master chassis 702 may be sent to a PXI-compliant slave star trigger card 706 in one or more other PXI-compliant slave chassis 704 via matched length differential cables and separate connectors on the master star trigger card 712. A dedicated connector may be employed on the master star trigger card 712 for each slave chassis 704 and the master chassis 702, to ensure that the delay to each chassis is the same. For example, in FIG. 7, a 10 MHz clock is received into the master star trigger card 712 at 708. This 10 MHz clock is buffered and distributed as PXI_CLK10 to other slave chassis 704 via connector 710. PXI_CLK10 is also distributed to the master star trigger card 712 via connector 714, where it loops back to the master star trigger card 712 via connector 716. Note that the cabling 718 and 720 are approximately the same length so that all chassis receive PXI_CLK10 at about the same time (assuming that the same PXI backplane version is used in all chassis). After PXI_CLK10 is received into the master star trigger card 712 via connector 716, it is converted to a singled-ended signal, buffered and distributed to modules within master chassis 702 via the backplane at 736.

Figure 8:
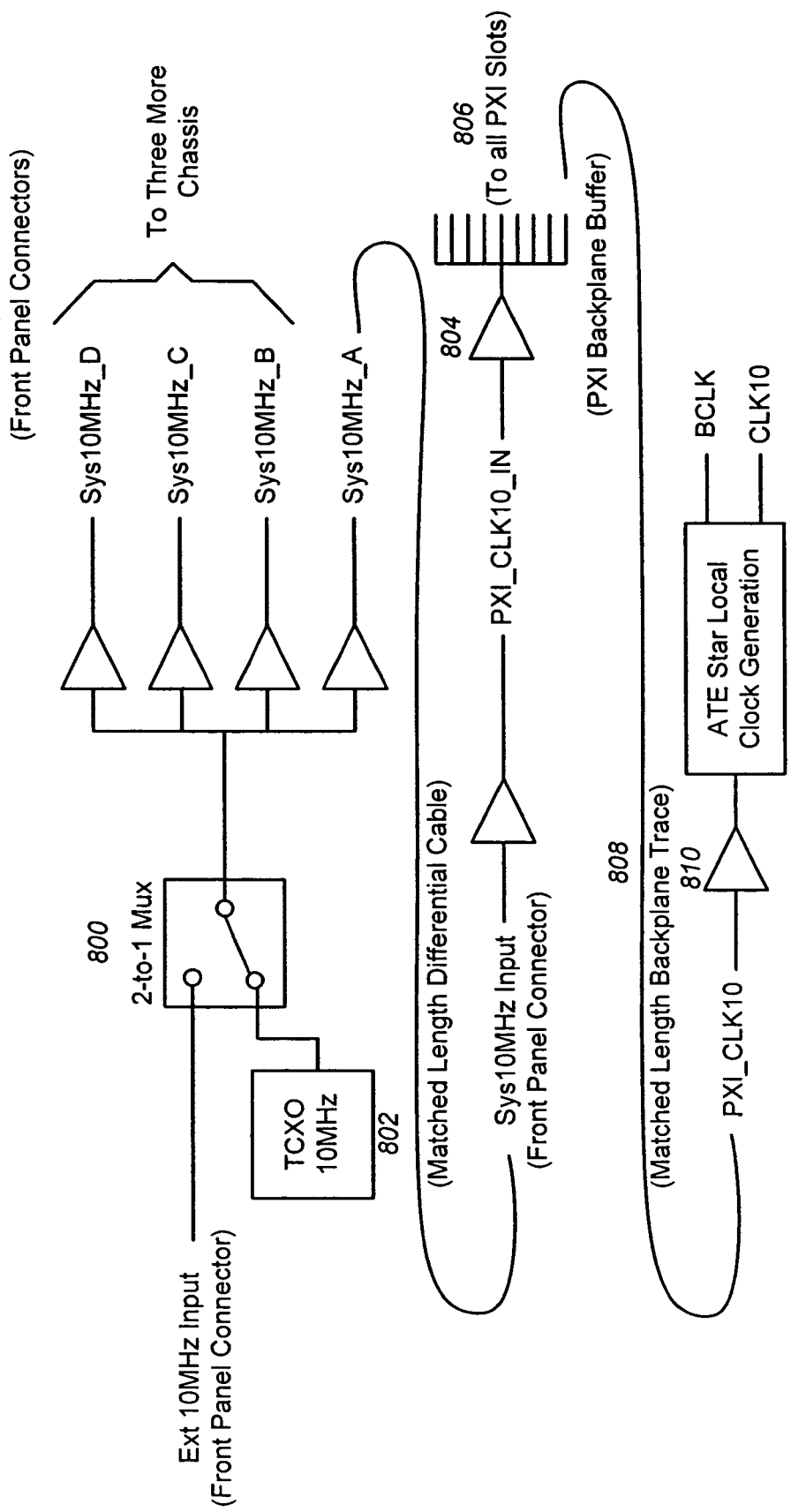
FIG. 8 illustrates an exemplary multi-chassis PXI_CLK10 distribution scheme according to embodiments of the present invention.

FIG. 8 is an illustration of the exemplary PXI_CLK10 distribution scheme described above, showing a switch 800 for switching between an external 10 MHz input received from a front panel connector and a 10 MHz signal generated from a Temperature Compensated crystal Oscillator (TCXO) 802. In the example of FIG. 8, all components except for a PXI backplane buffer 804 are located in a master star trigger card. Note that after the PXI_CLK10 is buffered by PXI backplane buffer 804, it is sent to all other slots via PXI_CLK10 traces 806 having about the same length, including a specification-compliant matched length trace 808 that returns to the master star trigger card and is received by a receive buffer 810. These traces are part of the standardized PXI backplane.

Figure 9:
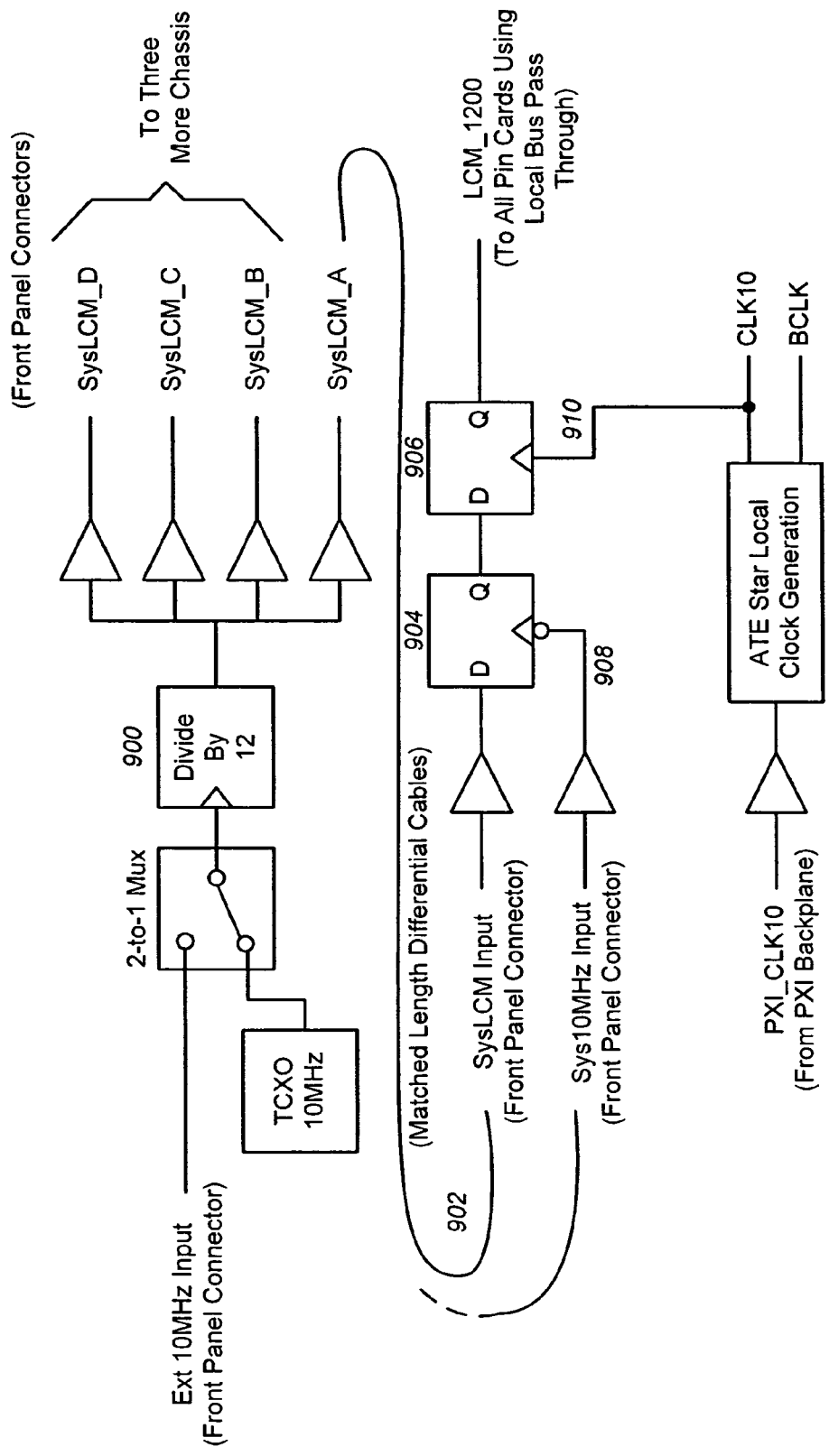
FIG. 9 illustrates an exemplary multi-chassis LCM distribution scheme according to embodiments of the present invention.

A similar scheme may be employed for LCM. FIG. 9 is an illustration of an exemplary LCM distribution scheme, showing how the LCM is generated from the 10 MHz clock using a divide by 12 circuit 900, and showing how the LCM signal 902 is resynchronized within the star trigger card using flip flops 904 and 906, reclocked first by the received 10 MHz clock 908 negative edge, then with the received PXI backplane 10 MHz clock 910 positive edge.

Although the present invention has been fully described in connection with embodiments thereof with reference to the accompanying drawings, it is to be noted that various changes and modifications will become apparent to those skilled in the art. Such changes and modifications are to be understood as being included within the scope of the present invention as defined by the appended claims.

What is claimed is:

1. A system for providing precise timing control between circuit cards, comprising:
   a chassis having a standardized specification, the chassis including specification-compliant slots and a backplane for providing electrical connections between circuit cards coupled to the slots;
   a specification-compliant star trigger card couplable to one of the slots for providing a reference clock and non-specification control signals to other specification-compliant circuit cards coupled to other slots in the chassis over pre-existing specification-compliant matched-length reference clock traces and a bus on the backplane that is user-configurable according to the specification, respectively; and
   one or more specification-compliant circuit cards couplable to slots in the chassis for receiving the reference clock and the non-specification control signals at about the same time and operating with precise timing control in accordance with the reference clock and control signals.

2. The system as recited in claim 1, further comprising a specification-compliant matched length loop back reference clock trace for receiving the reference clock from the star trigger card and providing the reference clock back to the star trigger card and enabling the star trigger card to receive the reference clock at about the same time as the other one or more circuit cards.

3. The system as recited in claim 2, the star trigger card comprising:
   a backplane buffer for driving the reference clock out over the reference clock traces and the loop back reference clock trace; and
   a reference clock receive buffer for receiving the reference clock from the loop back reference clock trace.

4. The system as recited in claim 1, the chassis comprising a Peripheral Component Interconnect (PCI) eXtensions for Instrumentation (PXI) chassis, the slots comprising PXI-compliant slots, the backplane comprising a PXI-compliant backplane, and the standardized specification comprising the PXI specification.

5. The system as recited in claim 4, the star trigger card comprising a PXI-compliant star trigger card.

6. The system as recited in claim 4, the specification-compliant matched-length reference clock traces comprising PXI_CLK10 traces.

7. The system as recited in claim 4, the specification-compliant user-configurable bus comprising a PXI_LOCAL bus.

8. A method for providing precise timing control between circuit cards coupled to specification-compliant slots in a chassis having a standardized specification, the chassis including a specification-compliant backplane for providing electrical connections between circuit cards coupled to the slots, the method comprising:
   utilizing pre-existing specification-compliant matched-length reference clock traces on the backplane to provide a reference clock to specification-compliant circuit cards coupled to slots in the chassis;
   utilizing a pre-existing bus on the backplane that is user-configurable according to the specification to provide one or more non-specification control signals to the specification-compliant circuit cards; and receiving the reference clock and the one or more non-specification control signals at the specification-compliant circuit cards at about the same time to allow the circuit cards to operate with precise timing control in accordance with the reference clock and control signals.

9. The method as recited in claim 8, the step of providing a reference clock comprising:

receiving and buffering the reference clock in a specification-compliant star trigger card;

driving the reference clock out over the specification-compliant matched-length reference clock traces that are connected to other circuit cards and also over a specification-compliant matched length loop back reference clock trace that is connected back to the star trigger card to enable the star trigger card to receive the reference clock at about the same time as the other circuit cards.

10. The method as recited in claim 8, the chassis comprising a Peripheral Component Interconnect (PCI) eXtensions for Instrumentation (PXI) chassis, the slots comprising PXI-compliant slots, the backplane comprising a PXI-compliant backplane, and the standardized specification comprising the PXI specification.

11. The method as recited in claim 10, wherein the star trigger card is a PXI-compliant star trigger card.

12. The method as recited in claim 10, wherein the specification-compliant matched-length reference clock traces are PXI_CLK10 traces.

13. The method as recited in claim 10, wherein the user-configurable specification-compliant bus is a PXI_LOCAL bus.

14. In a system including a chassis having a standardized specification, the chassis including specification-compliant slots and a backplane for providing electrical connections between circuit cards coupled to the slots, an apparatus for assisting in providing precise timing control between the circuit cards, comprising:

a specification-compliant star trigger card couplable to one of the slots for providing a reference clock and non-specification control signals to other specification-compliant circuit cards coupled to other slots in the chassis over pre-existing specification-compliant matched-length reference clock traces and a bus on the backplane that is user-configurable according to the specification, respectively.

15. The apparatus as recited in claim 14, the star trigger card comprising:

a backplane buffer for driving the reference clock out over the reference clock traces and a specification-compliant matched-length loop back reference clock trace; and a reference clock receive buffer for receiving the reference clock from the loop back reference clock trace;

wherein the loop back reference clock trace enables the star trigger card to receive the reference clock at about the same time as the other one or more circuit cards.

16. The apparatus as recited in claim 14, the star trigger card comprising a PXI-compliant star trigger card.

17. The apparatus as recited in claim 14, the specification-compliant matched-length reference clock traces comprising PXI_CLK10 traces.

18. In a system including a chassis having a standardized specification, the chassis including specification-compliant slots and a backplane for providing electrical connections between circuit cards coupled to the slots, a method for assisting in providing precise timing control between the circuit cards, the method comprising:

utilizing pre-existing specification-compliant matched-length reference clock traces and a bus on the backplane that is user-configurable according to the specification to provide a reference clock and non-specification control signals to specification-compliant circuit cards coupled to slots in the chassis, respectively.

19. The method as recited in claim 18, the step of providing a reference clock comprising:

receiving and buffering the reference clock in a specification-compliant star trigger card;

driving the reference clock out over the specification-compliant matched-length reference clock traces that are connected to other circuit cards and also over a specification-compliant matched length loop back reference clock trace that is connected back to the star trigger card to enable the star trigger card to receive the reference clock at about the same time as the other circuit cards.

20. The method as recited in claim 19, the star trigger card comprising a PXI-compliant star trigger card.

21. The method as recited in claim 18, the specification-compliant matched-length reference clock traces comprising PXI_CLK10 traces.

* * * * *